United States Patent [19]

Nelson

[11] Patent Number: 4,771,227
[45] Date of Patent: Sep. 13, 1988

[54] OUTPUT IMPEDANCE COMPENSATION CIRCUIT

[75] Inventor: Carl T. Nelson, San Jose, Calif.

[73] Assignee: Linear Technology Corporation, Milpitas, Calif.

[21] Appl. No.: 932,714

[22] Filed: Nov. 19, 1986

[51] Int. Cl.[4] ............................................. G05F 3/08
[52] U.S. Cl. .................................... 323/315; 323/312; 307/297
[58] Field of Search ...................... 323/312, 315, 316; 307/296 R, 297, 299 B

[56] References Cited

U.S. PATENT DOCUMENTS

| | | | |
|---|---|---|---|
| 3,878,471 | 4/1975 | Ahmed | 323/315 X |
| 3,986,152 | 10/1976 | Howell | 323/315 X |
| 4,246,500 | 1/1981 | Okada et al. | 307/299 B |
| 4,413,227 | 11/1983 | Johnson | 323/315 |
| 4,634,959 | 1/1987 | Boeckmann | 323/313 |
| 4,686,387 | 8/1987 | Rumelhard | 323/315 X |

*Primary Examiner*—Patrick R. Salce
*Assistant Examiner*—Kristine Peckman
*Attorney, Agent, or Firm*—Laurence S. Rogers

[57] ABSTRACT

A circuit is provided for reducing the output impedance of an emitter-follower transistor in which a positive feedback voltage proportional to the collector current of the emitter-follower transistor is provided to the base of the emitter-follower transistor when the emitter-follower transistor supplies current to a load. The circuit includes a resistor-ratioed current source which provides collector current to the emitter-follower transistor and which forces a current through a resistor connected to the base of the output transistor in proportion to the collector current.

10 Claims, 2 Drawing Sheets

OUTPUT IMPEDANCE COMPENSATION CIRCUIT

BACKGROUND OF THE INVENTION

The present invention relates to a circuit for providing positive feedback in an emitter-follower output circuit to reduce the output impedance of the emitter follower.

The designation "emitter-follower circuit" refers herein to a transistor biasing circuit in which a voltage developed at the emitter of the transistor is made available to a load. The voltage applied to the load is referred to herein as the output voltage, and the current drawn by the load is referred to as the output current.

The output impedance of an emitter-follower is a measure of the change in the output voltage of the circuit which results from a change in the output current. It is a function of the small signal emitter resistance of the transistor, the value of any resistance between the base-emitter junction of the transistor and the output terminal, the beta of the transistor, and the equivalent impedance of the circuitry driving the base of the emitter follower. A positive output impedance causes the output voltage of the emitter-follower circuit to decrease when an output current is drawn from the emitter-follower circuit by a load.

In circuit applications where it is desired that the emitter-follower output voltage be maintained substantially constant over a range of output cirrents, non-zero output impedance undesirably limits the range of output currents over which the emitter-follower circuit can be expected to maintain a substantially constant output voltage. The output current of an emitter-follower circuit is a function of load impedance. For that reason, a positive output impedance limits the range of load impedance to which a substantially constant output voltage can be supplied.

In view of the foregoing, it would be desirable to provide a circuit for reducing the output impedance of an emitter-follower circuit such that the output voltage of the emitter-follower circuit is maintained at a substantially constant value over a wide range of output currents.

It also would be desirable to provide a circuit for reducing the output impedance of an emitter-follower circuit such that the decrease in emitter output voltage when the output current is increased is minimized.

It further would be desirable to provide a circuit for reducing the output impedance of an emitter-follower circuit to a negative value such that the emitter output voltage increases when the output current is increased.

SUMMARY OF THE INVENTION

It is therefore an object of the present invention to provide a circuit which adjusts the output impedance of an emitter-follower circuit to maintain a substantially constant output voltage over a wide range of output currents.

It is a further object of the present invention to provide a circuit which reduces the output impedance of an emitter-follower circuit to substantially zero.

It is yet another object of the present invention to provide a circuit which reduces the output impedance of an emitter-follower circuit to a negative value.

These and other objects of the present invention are accomplished by a circuit which provides a positive feedback voltage to the base of a transistor in an emitter-follower circuit as a function of the collector current of the transistor.

BRIEF DESCRIPTION OF THE DRAWINGS

The above and other objects and advantages of the present invention will be apparent upon consideration of the following detailed description, taken in conjunction with the accompanying drawings, in which like reference characters refer to like parts throughout, and in which.

DETAILED DESCRIPTION OF THE INVENTION

Figure 1:
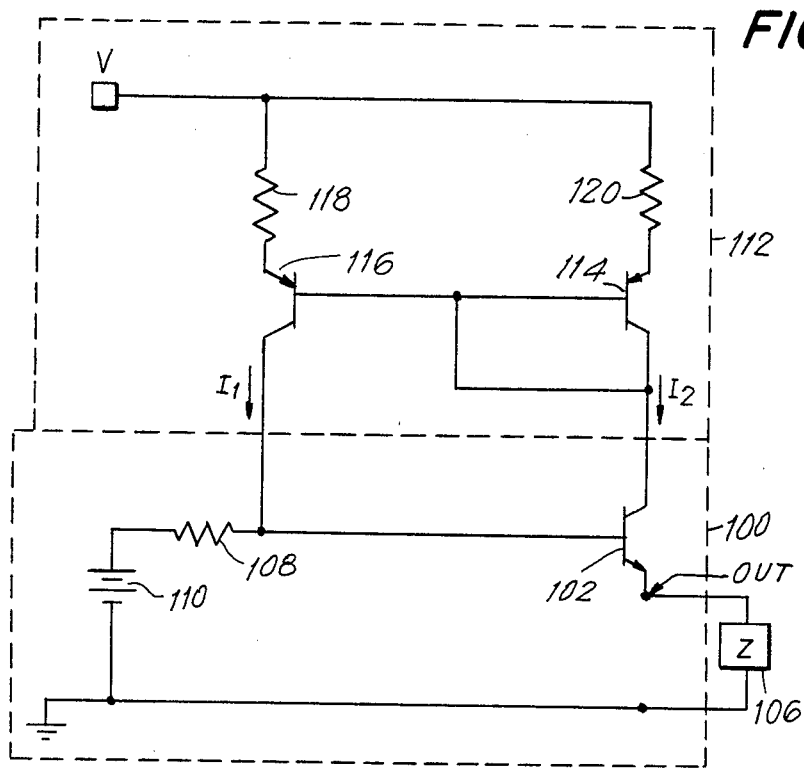
FIG. 1 is a schematic diagram of a first embodiment of the output impedance compensation circuit of the present invention including a current mirror circuit.

Referring to FIG. 1, emitter-follower circuit 100 includes output transistor 102. The emitter of output transistor 102 is connected to one end of load 106, the other end of load 106 being connected to ground. The base of output transistor 102 is connected to one end of base resistor 108, the other end of which is connected to voltage source 110.

Associated with emitter-follower circuit 100 is a current mirror circuit 112 including transistors 114 and 116 and resistors 118 and 120. Voltage supply V, connected to one end of each of resistors 118 and 120, provides a supply voltage to current mirror circuit 112. The other end of resistor 118 is connected to the emitter of transistor 116, and the other end of resistor 120 is connected to the emitter of transistor 114. The base and collector of transistor 114 are connected to the base of transistor 116 and to the collector of output transistor 102.

Application of the supply voltage V to current mirror circuit 112 generates current $I_1$ flowing out of the collector of transistor 116 and current $I_2$ flowing out of the base/collector node of transistor 114. Assuming that the resistance of resistor 120 and resistor 118 is large compared to the small signal emitter resistance of transistors 114 and 116, respectively, and neglecting base currents, the ratio of current $I_1$ to current $I_2$ is approximately equal to the ratio of the value of resistor 120 to the value of resistor 118. (A desired ratio of current $I_1$ to $I_2$ alternatively may be obtained by utilizing transistors 116 and 114 which have a known, fixed emitter area ratio. If ratioed transistors are used, resistors 118 and 120 can be eliminated.)

During operation, voltage source 110 forward biases the base-emitter junction of output transistor 102 causing current $I_2$ to flow into the collector of output transistor 102. Neglecting base current, current $I_2$ flows out of the emitter of output transistor 102 and is provided to load 106. The flow of current $I_2$ causes current $I_1$ to flow in proportion to current $I_2$ as determined by the ratio of resistors 118 and 120. Again neglecting base current, current $I_1$ conducted by base resistor 108 causing the voltage applied to the base of output transistor 102 to increase. The voltage applied to the base of output transistor 102 is therefore a function of current $I_2$, and a positive feedback loop is established. An increase in the voltage applied to the base of output transistor 102 therefore attempts to cause a corresponding increase in the voltage at the emitter of output transistor 102.

By offsetting the increase in emitter voltage resulting from the positive feedback loop against the decrease in emitter voltage caused by the output impedance of the emitter-follower, the positive feedback loop reduces the effective output impedance of the emitter-follower. By reducing the output impedance, the positive feedback loop increases the range of output current over which the output voltage of the emitter-follower circuit is held substantially constant.

The response of the positive feedback loop is determined by the values of resistors 108, 118 and 120. The values are preferably chosen such that the base voltage of output transistor 102 increases by the same amount that the emitter-base voltage of transistor 102 increases with an increase in current supplied to load 106, giving the emitter-follower an effective output impedance of zero. This occurs if the value of base resistor 108, when multiplied by the ratio of the value of resistor 120 over the value of resistor 118, equals the effective emitter resistance ($R_{EFF}$). The effective emitter resistance, in turn, equals the sum of small signal emitter resistance $r_e$ of output transistor 102, the base resistance 108 divided by the current gain ($\beta$) of the emitter-follower, and any additional resistance $R_E$ (including parasitic resistance) between the base-emitter junction of the emitter-follower and the output terminal of the emitter-follower: $R_{EFF} = r_e + R_{108}/\beta + R_E$. The emitter resistance $r_e$ of a transistor is approximately equal to $V_T/I_C$, where $V_T$ is the thermal voltage and $I_C$ is the collector current of the transistor. Thermal voltage $V_T$ is determined by the formula $V_T = kT/q$, where k is Boltzmann's constant, q is the electronic charge, and T is the absolute temperature. At a temperature of 25° C., thermal voltage $V_T$ is approximately equal to 26 mV. Therefore, the emitter resistance $r_e$ of a transistor is approximately equal to 26 ohms at a collector current of one milliamp and 25° C. In the embodiment of FIG. 1, assuming a value of $r_e$ of 26 ohms, a $\beta$ of 100, and $R_E = 0$, preferable values of resistors 108, 118 and 120 are 1.3K ohms, 6.66K ohms, and 200 ohms, respectively. It will, of course, be appreciated that other values of resistance may be used depending on the magnitude of the emitter current, the temperature, the $\beta$, and the desired value of output impedance of the emitter-follower. The emitter-follower circuit can be given a negative or positive output impedance by choosing different values of resistors 108, 118 and 120.

Because the value of emitter resistance $r_e$ is a function of the collector current, the chosen values of resistors 108, 118 and 120 can be made to cancel the effect of effective resistance $R_{EFF}$, and the output impedance of the circuit of FIG. 1 can be made equal to zero, only at a particular collector current. The effective value of emitter resistance $R_{EFF}$, however, may not vary greatly as output current varies due to the constant terms, $R_{108}/\beta$ and $R_E$. Therefore, the emitter-follower circuit of the present invention can be given an output impedance which is substantially lower than the output impedance of a conventional emitter-follower transistor over a wide range of output currents. As compared to an emitter-follower without the circuitry of the present invention, the present invention is capable of providing an order of magnitude or more reduction in output impedance over a wide range of output currents.

Figure 2:
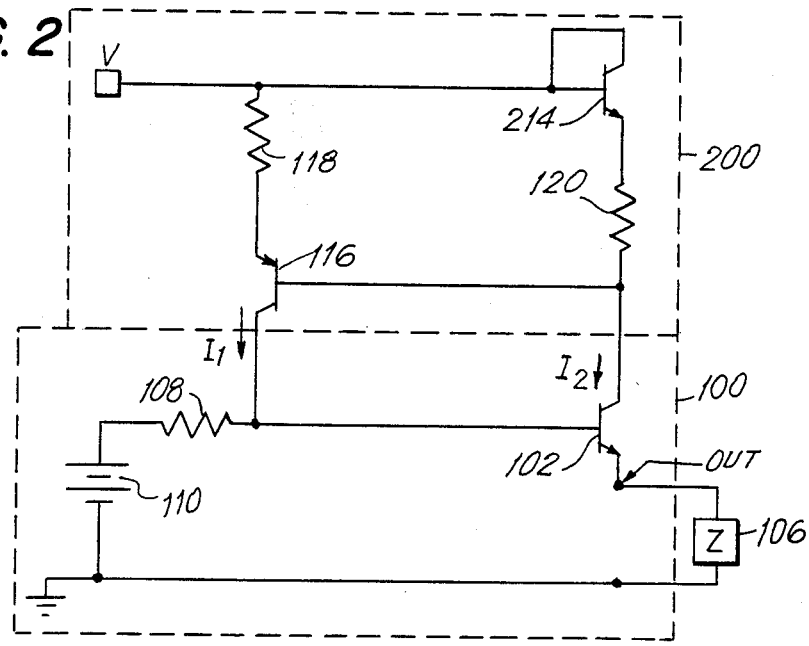
FIG. 2 is a schematic diagram of a second embodiment of the output impedance compensation circuit of the present invention.

FIG. 2 shows an alternative embodiment of an output impedance compensation circuit in accordance with the present invention. Emitter-follower circuit 100 is connected to a compensation circuit 200 comprising transistors 214 and 116 and resistors 118 and 120. The collector of transistor 116 is connected to the base of output transistor 102 and to one end of base resistor 108. The emitter of transistor 116 is connected to one end of resistor 118, the other end of which is connected to voltage supply V. The base of transistor 116 is connected to the collector of output transistor 102 and to one end of resistor 120, the other end of which is connected to the emitter of transistor 214. The base and collector of transistor 214 are connected to voltage supply V, causing transistor 214 to act as a diode having an anode connected to voltage supply V.

During operation, the voltages across the base-emitter junctions of transistors 214 and 116 are substantially equal, which forces the voltages across the resistors 118 and 120 to be substantially equal. Neglecting base currents, current $I_1$ flowing from the collector of transistor 116 is approximately equal in magnitude to the value of current $I_2$ flowing into the collector of output transistor 102 multiplied by the ratio of the value of resistor 120 to the value of resistor 118. Again ignoring base currents, current $I_1$ is substantially equal to the current flowing through base resistor 108. As with the circuit of FIG. 1, the voltage applied to the base of output transistor 102 is a function of current $I_2$, and thus a positive feedback loop is established which reduces the output impedance of the emitter-follower circuit. An output impedance of or about zero is preferably obtained by setting the product of the value of base resistor 108 and the ratio of the value of resistor 120 to the value of resistor 118 equal to the effective emitter resistance of output transistor 102. To establish a value of output impedance other than zero, different values are chosen for resistors 108, 118 and 120.

Figure 3:
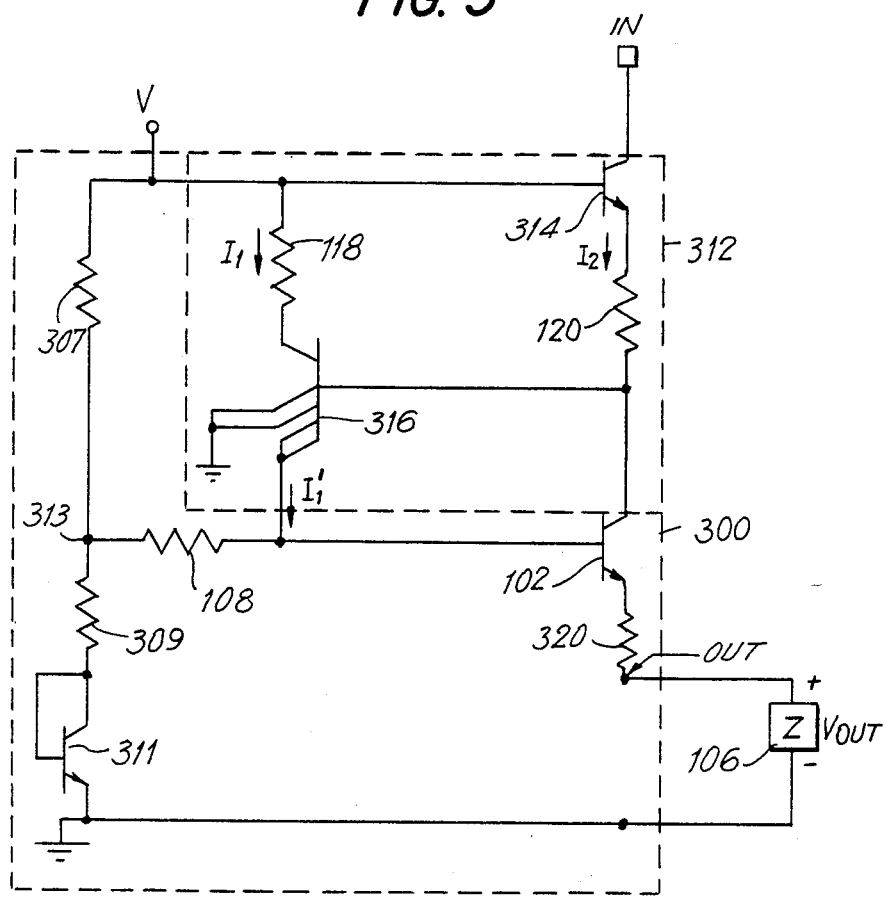
FIG. 3 is a schematic diagram of a third embodiment of the output impedance compensation circuit of the present invention in an integrated voltage regulator.

FIG. 3 shows an embodiment of the output impedance compensation circuit of the present invention in an integrated circuit voltage regulator circuit. The values given below for the parameters of the circuit were chosen to provide an output voltage $V_{OUT}$ across load 306 of approximately 0.4 volts when current $I_{OUT}$ having a magnitude ranging from a few microamps to several milliamps is supplied to load 106, and are given for purposes of illustration and not of limitation.

Emitter-follower circuit 300 includes output transistor 102 having an emitter connected to one end of resistor 320, the other end of which is connected to load 106. The base of output transistor 102 is connected to one end of base resistor 108. The other end of base resistor 108 is connected to one end of resistor 307 and to one end of resistor 309. The other end of resistor 309 is connected to the base and collector of transistor 311, the emitter of which is connected to ground, and the other end of resistor 307 is connected to a voltage supply V. The values of voltage supply V, resistors 307 and 309 are preferably chosen to produce a voltage of approximately one volt at junction 313.

Associated with emitter-follower circuit 300 is a compensation circuit 312, including transistors 314 and 316, and resistors 118 and 120. Transistor 316 has multiple collectors, some of which are connected to the base of output transistor 102 and to one end of base resistor 108, and others of which are connected to ground. The ratio of the area of the collectors connected to the base of output transistor 102 and base resistor 108 over the total collector area of transistor 316 is referred to herein as collector ratio n, having a value between 0 and 1. The base of transistor 316 is connected to the collector of output transistor 102 and to one end of resistor 120, the other end of which is connected to the emitter of transistor 314. The emitter of transistor 316 is connected to one end of resistor 118, the other end of which is connected to the base of transistor 314 and to voltage supply V. The collector of transistor 314 is preferably connected to a voltage supply $V_{in}$. By replacing transistor diode 214 of FIG. 2 with transistor 314, the current drawn into the collector of transistor 314 may be used by surrounding circuitry (not shown) to sense the condition of the impedance compensation circuit.

During operation, the base-emitter junction voltages of transistors 314 and 316 are substantially equal, which forces the voltages across resistors 118 and 120 to be substantially equal. This in turn forces current $I_1$ flowing into the emitter of transistor 316 to equal the current $I_2$ flowing out of the emitter of transistor 314 multiplied by the ratio of resistor 120 over resistor 118. Current $I_1'$ flowing into the junction of base resistor 108 and the base of output transistor 102 is the product of current $I_1$ and collector ratio n. The ratio of current $I_1'$ to current $I_2$ is approximately equal to the product of collector ratio n and the ratio of the value of resistor 120 to the value of resistor 318. Neglecting base currents, current $I_1'$ is conducted by base resister 108 and current $I_2$ flows into the collector of output transistor 102. When current $I_{OUT}$ is drawn by load 106 through resistor 320, the increase in current $I_2$ causes a proportional increase in current $I_1'$, which in turn causes an increase in the voltage applied to the base of output transistor 102. The increase in the base voltage of output transistor 102 compensates for the increased emitter-base voltage of transistor 102 and the increase in the voltage across resistor 320, resulting in a substantially reduced drop in output voltage and an increased load current.

The approximate output impedance ($Z_{OUT}$) of the circuit is defined by the formula $Z_{OUT} = [kT/qI_C + R_0 + R_b/\beta] - [R_1/R_2 \times nR_b]$, where $R_0$ is the value of stabilizing resistor 320, $R_1$ is the value of resistor 120, $R_2$ is the value of resistor 118, $R_b$ is the value of base resistor 108 plus the Thevenin resistance of resistors 307 and 309, and $\beta$ is the current gain of transistor 102.

The output impedance of the circuit is reduced to zero by choosing values for $R_1$, $R_2$, $R_b$ and n which will produce a negative term equal in magnitude to the positive term in the above formula. As can be seen, the circuit provides three different means for varying the compensation term for a given emitter resistance, $r_e$, transistor gain, $\beta$, of transistor 102, and resistor 320: the ratio of resistors 120 and 118 can be varied; the value of base resistor 108 can be varied; and the collector ratio n can be varied. The circuit of the present invention thus permits flexibility in design. For instance, the resulting output impedance ($Z_{OUT}$) can be made negative by appropriate choice of the compensating term. In some situations, the fact that output voltage actually increases with increased load current is a desired condition.

Thus, an output impedance compensation circuit for an emitter-follower circuit is provided. One skilled in the art will appreciate that the present invention can be practiced by other than the described embodiments, which are presented for purposes of illustration and not of limitation, and the present invention is limited only by the claims which follow.

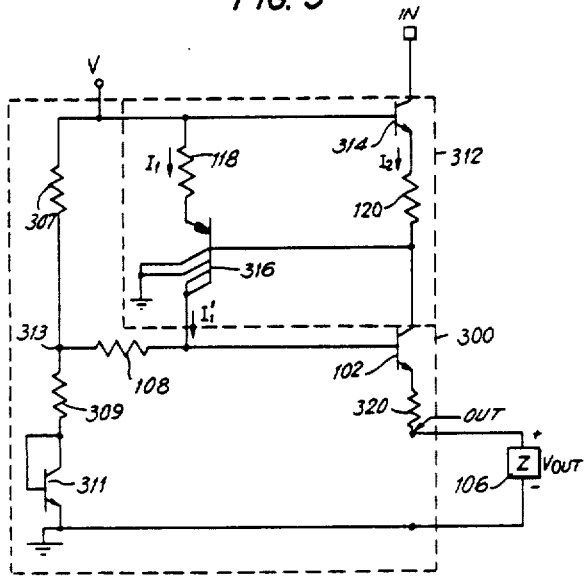

What is claimed is:

1. A circuit for biasing a transistor connected as an emitter-follower, the emitter-follower transistor having an output impedance and a collector, an emitter and a base, the circuit comprising:

a first terminal for connection to a first supply of voltage and a second terminal for connection to a second supply of voltage;

means for supplying current from the first terminal to the collector of the emitter-follower transistor, said current supply means including a first transistor having a collector, and emitter and a base;

means connected to the second terminal for applying a bias voltage to the base of the emitter-follower transistor; and means connected to said current supply means, to said bias voltage means, and to said second terminal for sensing the magnitude of current supplied to the collector of the emitter-follower transistor and responsively increasing the bias voltage when the collector current conducted by the emitter-follower transistor increases, said current sensing means including a second transistor having a collector, an emitter and a base, said second transistor having a polarity complementary to the polarity of said first transistor, whereby substantially all of the current conducted by the emitter-follower transistor is drawn from the first terminal and the output impedance of the emitter-follower transistor is reduced.

2. The circuit of claim 1, wherein the polarity of said first transistor is npn, and the polarity of said second transistor is pnp.

3. The circuit of claim 1, further comprising:

means for connecting the base-emitter junctions of said first and second transistors serially in a loop, such that said second transistor conducts a current directly proportional to current supplied by said first transistor.

4. The circuit of claim 3, wherein said connecting means comprises:

a first resistor connected between the base of said first transistor and the emitter of said second transistor; and a second resistor connected between the base of said second transistor and the emitter of said first transistor; and wherein:

the ratio of the current conducted by said second transistor to the current conducted by said first transistor is approximately equal to the ratio of said first resistor to said second resistor.

5. The circuit of claim 1 or claim 3, wherein said means for applying a bias voltage comprises:

a voltage divider means having a node for producing an intermediate voltage which is less than the voltage at the second terminal; and means for applying at least a portion of the intermediate voltage to the base of the emitter-follower transistor.

6. The circuit of claim 5, wherein said intermediate voltage applying means comprises a resistor connected between the node and the base of the emitter-follower transistor.

7. The circuit of claim 1, wherein the voltage at the first terminal is greater than the voltage at the second terminal.

8. A circuit for biasing a transistor connected as an emitter-follower, the emitter-follower transistor having an output impedance and a collector, an emitter and a base, the circuit comprising:

a first supply terminal for connection to a first voltage, and a second supply terminal for connection to a second voltage;

means for applying a bias voltage to the base of the emitter-follower transistor;

an npn transistor having a collector connected to draw current from said first terminal, a base connected to draw current from said second terminal, and an emitter connected to supply its emitter current to the collector of the emitter-follower transistor; and a pnp transistor having a collector connected to the base of the emitter-follower transistor, an emitter, and a base; wherein:

the base-emitter circuits of said first and second transistors are connected serially in a loop such that a compensating voltage is applied to the base of the emitter-follower transistor which increases in response to increased current conducted by the collector of the emitter-follower transistor, whereby the output impedance of the emitter-follower transistor is reduced.

9. The circuit of claim 8, wherein substantially all of the current conducted by the emitter-follower transistor is drawn from said first terminal.

10. The circuit of claim 9, wherein the voltage at said first terminal is greater than the voltage at said second terminal.

* * * * *

UNITED STATES PATENT AND TRADEMARK OFFICE
CERTIFICATE OF CORRECTION

PATENT NO. : 4,771,227

DATED : September 13, 1988

INVENTOR(S) : Carl T. Nelson

It is certified that error appears in the above-identified patent and that said Letters Patent is hereby corrected as shown below:

Column 1, line 30, "cirrents" should be --currents--.

Column 2, line 63, after "$I_1$" insert --is--.

Column 5, line 24, "$1_I$" should be --$I_1$--.

Column 5, line 28, "$I_I'$" should be --$I_1'$--.

Column 5, line 32, "$I_I'$" should be --$I_1'$--.

Column 6, line 12, "and" (first occurrence) should be --an--.

The Title Page should be deleted and substitute the attached Title Page, correcting the illustrative figure.

Signed and Sealed this

Twenty-seventh Day of June, 1989

Attest:

DONALD J. QUIGG

Attesting Officer

Commissioner of Patents and Trademarks

United States Patent [19]

Nelson

[11] Patent Number: 4,771,227
[45] Date of Patent: Sep. 13, 1988

[54] OUTPUT IMPEDANCE COMPENSATION CIRCUIT

[75] Inventor: Carl T. Nelson, San Jose, Calif.

[73] Assignee: Linear Technology Corporation, Milpitas, Calif.

[21] Appl. No.: 932,714

[22] Filed: Nov. 19, 1986

[51] Int. Cl.⁴ .................................................. G05F 3/08
[52] U.S. Cl. ...................................... 323/315; 323/312; 307/297
[58] Field of Search ......................... 323/312, 315, 316; 307/296 R, 297, 299 B

[56] References Cited

U.S. PATENT DOCUMENTS

| | | | |
|---|---|---|---|
| 3,878,471 | 4/1975 | Ahmed | 323/315 X |
| 3,986,152 | 10/1976 | Howell | 323/315 X |
| 4,246,500 | 1/1981 | Okada et al. | 307/299 B |
| 4,413,227 | 11/1983 | Johnson | 323/315 |
| 4,634,959 | 1/1987 | Boeckmann | 323/313 |
| 4,686,387 | 8/1987 | Rumelhard | 323/315 X |

Primary Examiner—Patrick R. Salce
Assistant Examiner—Kristine Peckman
Attorney, Agent, or Firm—Laurence S. Rogers

[57] ABSTRACT

A circuit is provided for reducing the output impedance of an emitter-follower transistor in which a positive feedback voltage proportional to the collector current of the emitter-follower transistor is provided to the base of the emitter-follower transistor when the emitter-follower transistor supplies current to a load. The circuit includes a resistor-ratioed current source which provides collector current to the emitter-follower transistor and which forces a current through a resistor connected to the base of the output transistor in proportion to the collector current.

10 Claims, 2 Drawing Sheets

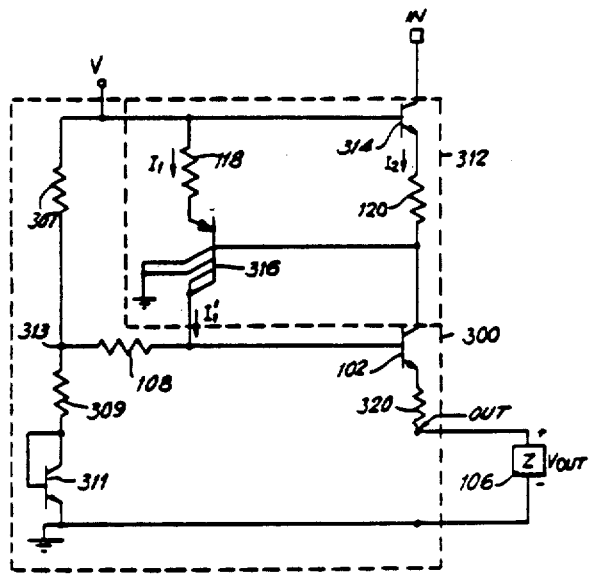

UNITED STATES PATENT AND TRADEMARK OFFICE
CERTIFICATE OF CORRECTION

PATENT NO. : 4,771,227

DATED : September 13, 1988

INVENTOR(S) : Carl T. Nelson

It is certified that error appears in the above-identified patent and that said Letters Patent is hereby corrected as shown below:

In the drawings, FIG. 3 should be replaced with the following drawing.